(12) United States Patent  
Franklin

(10) Patent No.: US 9,185,975 B2  
(45) Date of Patent: Nov. 17, 2015

(54) MODULAR STACKABLE SHELVING FRAMEWORK AND EQUIPMENT STORAGE SYSTEM

(75) Inventor: Barrett W. Franklin, San Diego, CA (US)

(73) Assignee: UltraFrame Holdings, LLC, Reno, NV (US)

( * ) Notice: Subject to any disclaimer, the term of this patent is extended or adjusted under 35 U.S.C. 154(b) by 723 days.

(21) Appl. No.: 13/371,727

(22) Filed: Feb. 13, 2012

(65) Prior Publication Data

US 2013/0208420 A1     Aug. 15, 2013

(51) Int. Cl.
| | |
|---|---|
| H05K 5/00 | (2006.01) |
| H05K 7/00 | (2006.01) |
| A47B 87/02 | (2006.01) |
| H05K 7/14 | (2006.01) |

(52) U.S. Cl.
CPC .......... *A47B 87/0276* (2013.01); *H05K 7/1488* (2013.01); *Y10T 29/49826* (2015.01)

(58) Field of Classification Search
CPC ........................... G06F 1/181; H05K 7/20172
USPC .......... 361/679.01–679.61; 248/27.1, 223.31, 248/223.41
See application file for complete search history.

(56) References Cited

U.S. PATENT DOCUMENTS

| 6,820,950 | B1 | 11/2004 | Sun | |
| 7,100,999 | B2 * | 9/2006 | Stravitz | 312/111 |
| 7,301,768 | B2 | 11/2007 | Fan et al. | |
| 2002/0093272 | A1 | 7/2002 | Saravis | |
| 2003/0043537 | A1 * | 3/2003 | Clidaras et al. | 361/683 |
| 2006/0084375 | A1 * | 4/2006 | Chang | 454/184 |
| 2011/0079565 | A1 | 4/2011 | Alli | |

FOREIGN PATENT DOCUMENTS

JP     3106908     1/2005

OTHER PUBLICATIONS

International Search Report, PCT/US2013/025927, Jun. 2, 2013, 4 pgs.

* cited by examiner

Primary Examiner — Jerry Wu  
(74) Attorney, Agent, or Firm — Fish & Richardson P.C.

(57) ABSTRACT

A modular storage system and method, a module and a method of making the same include a top panel and a bottom panel, each of the top panel and bottom panel comprising first and second opposed edges, and first and second side members. Each of the first and second side members comprises: a top edge and a bottom edge, the top edges of the first and second side members being attached to the opposed edges of the top panel, and the bottom edges of the first and second side members being attached to the opposed edges of the bottom panel; and a longitudinal attachment feature running along a length of the side member along a longitudinal axis of the side member, longitudinal attachment features of first and second modules enabling coupling together of the first and second modules.

34 Claims, 8 Drawing Sheets

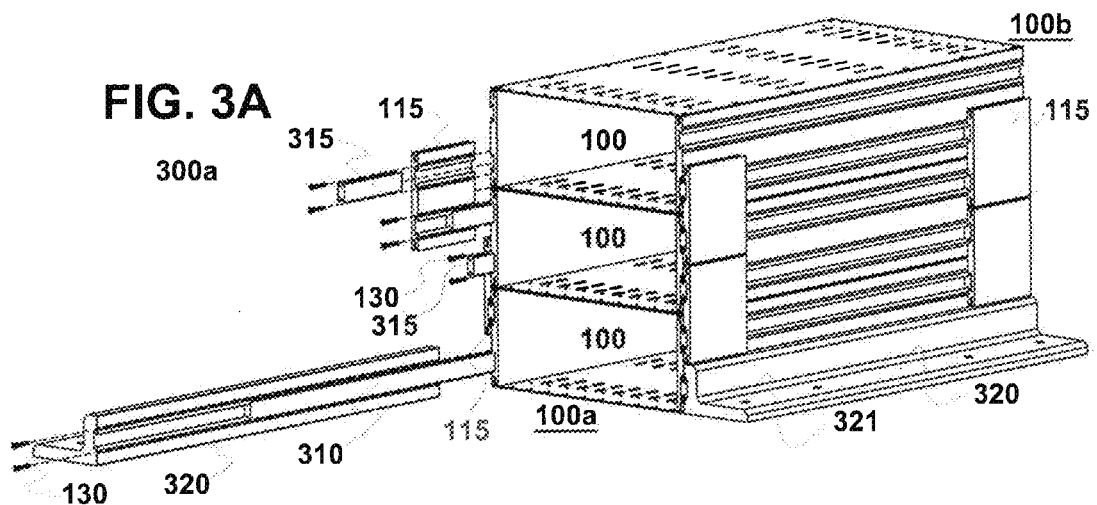
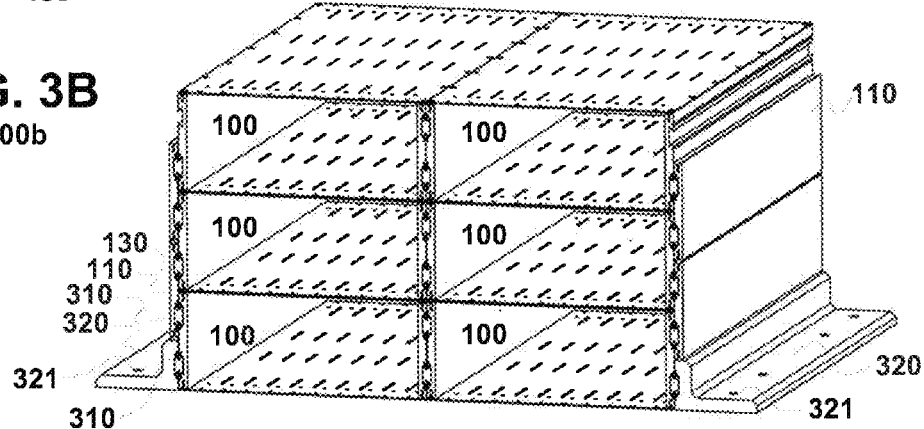
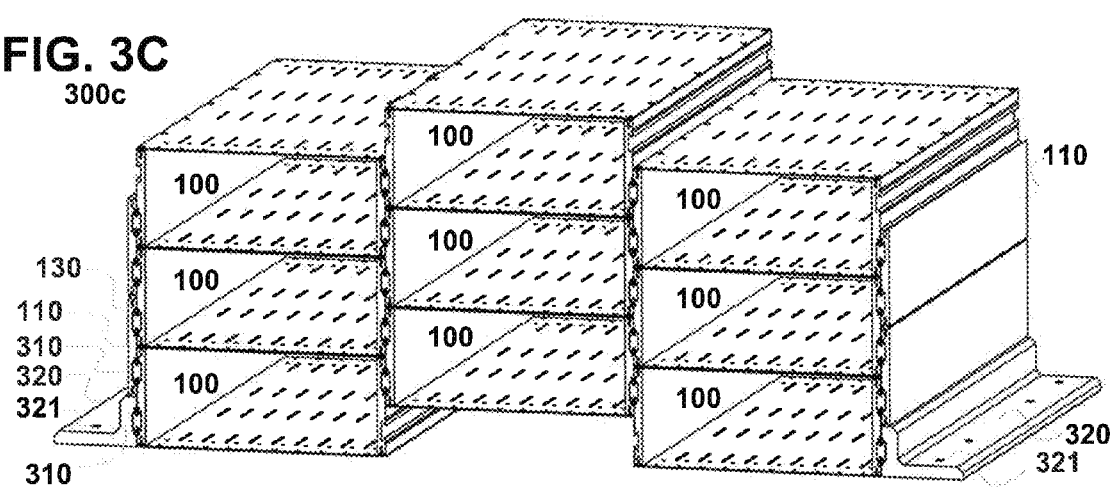

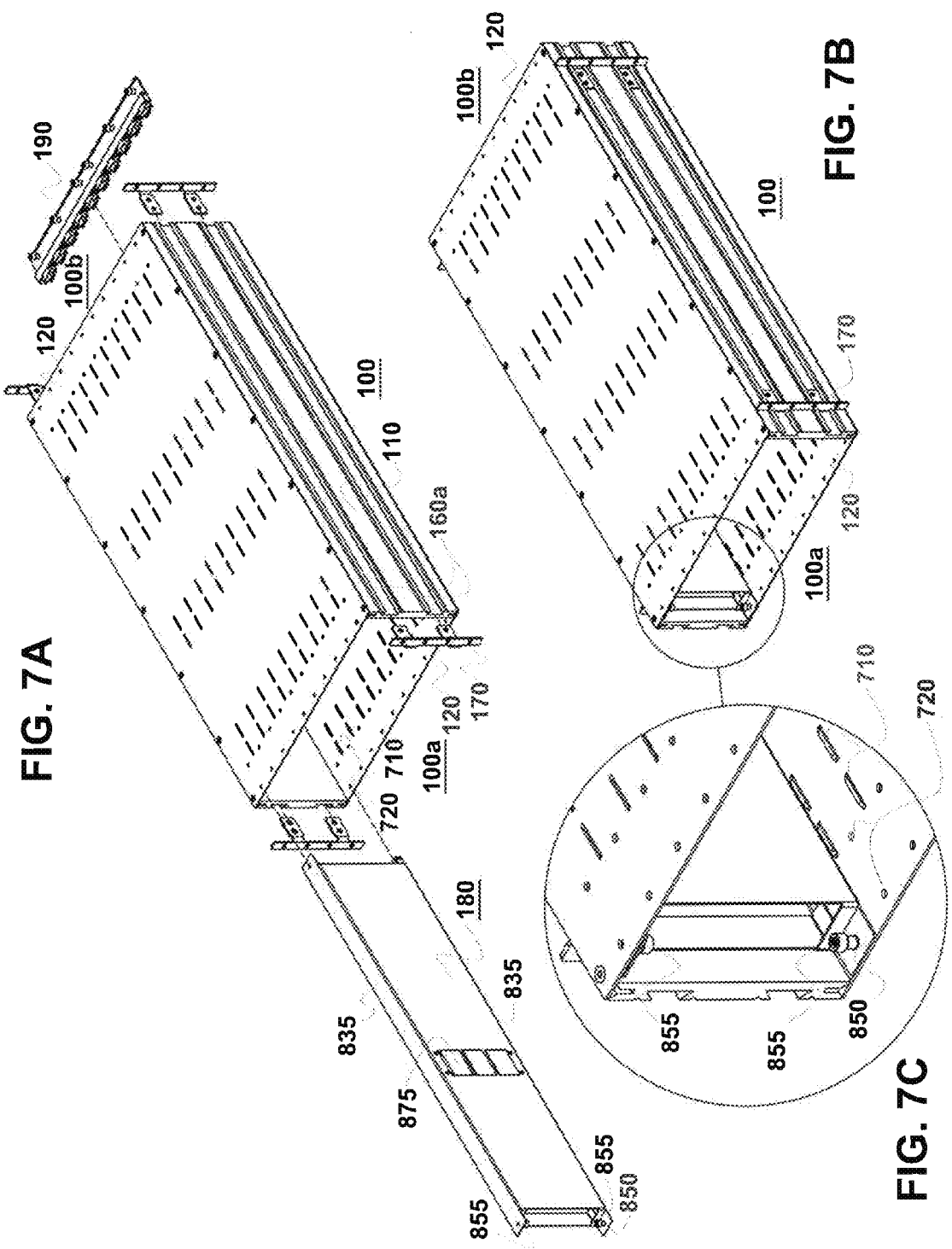

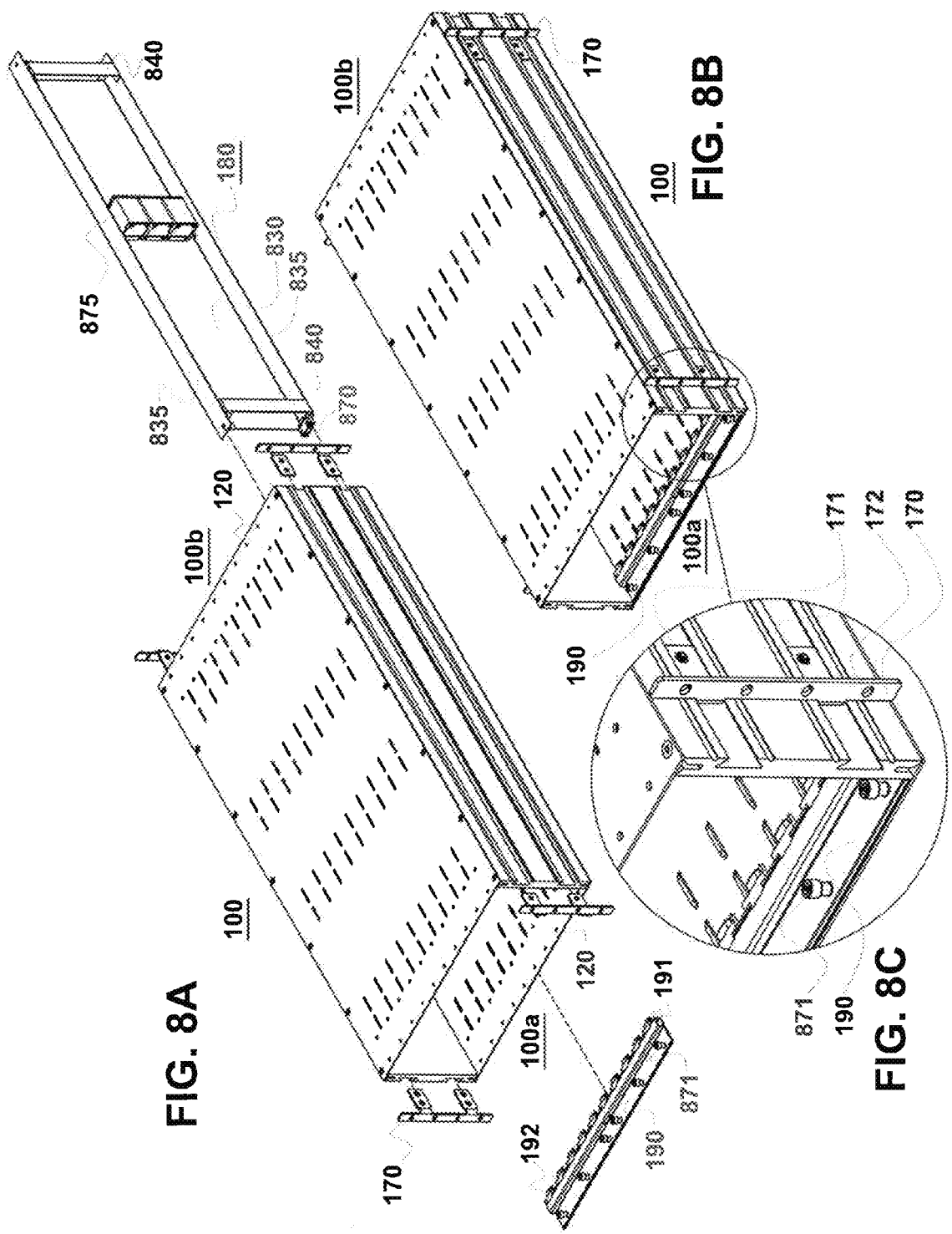

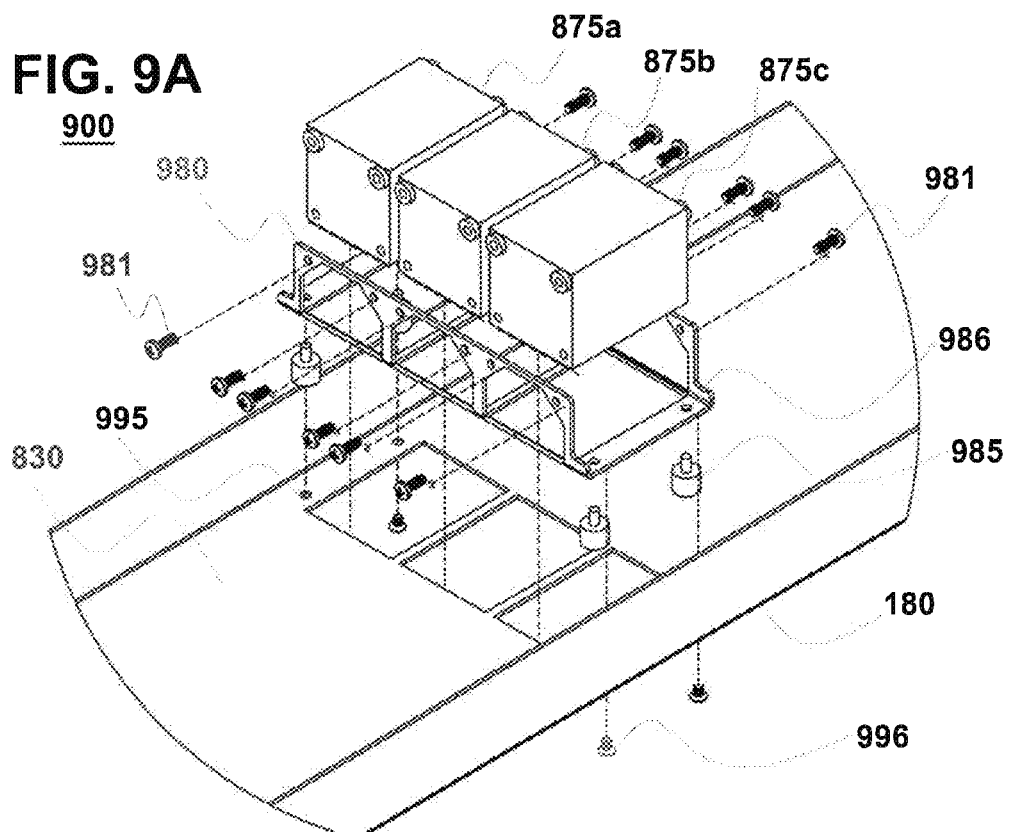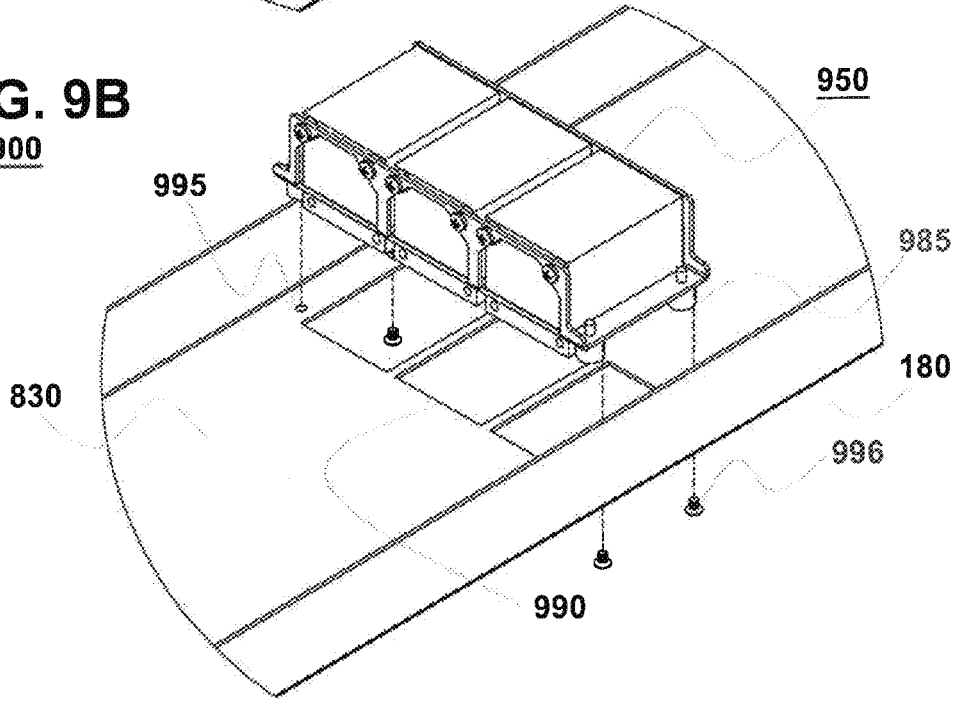

MODULAR STACKABLE SHELVING FRAMEWORK AND EQUIPMENT STORAGE SYSTEM

BACKGROUND

1. Field of Invention

The present invention relates to shelving systems and equipment storage management and more particularly to a structurally integrated building-block shelf frame system for storing electronic and non-electronic equipment that can be mechanically interconnected with minimal labor content to assemble the resultant structure without the requirement of equipment rack cabinets.

2. Discussion of the Prior Art

Datacenters are designed and constructed to optimize power and cooling requirements for a plurality of electric components such as power supplies, memory units, network appliances and servers. Since their introduction into datacenters, most of these electric devices have been adapted to fit into rack mountable appliance chassis. Rack mountable electric appliance chassis are typically constructed of steel sheet metal which adds considerable weight and mass to the overall electric component. In datacenters, the steel appliance chassis housing the electric components are then mounted into standardized equipment racks.

In general, equipment racks are produced in standard sizes such as "full height" that are approximately six feet in height, or "half high" racks that are approximately three feet in height. The equipment racks are designed to receive electronic appliances of variable height based upon a standardized scale referred to as the "Rack Unit", "RU" or "U", a unit of measure equal to 1.75 inches (44.45 mm). Thus, a standard full height 42 U equipment rack could store forty-two 1 U, or twenty-one 2U electronic component appliance chassis. The 19" rack mounting fixture includes two parallel metal strips (referred to as "posts" or "panel mounts") standing vertically. The posts are 0.625 inches (15.88 mm) wide, and separated by a distance of 17.75 inches (450.85 mm) for the mounting of the electronic equipment chassis, thus giving an overall rack width of 19 inches (482.6 mm) and effectively limiting the maximum width of equipment to 17.75" (450.85 mm) with a minimum height of 1 U or 1.75 inches (44.45 mm).

Known initially as "relay racks," equipment racks were adapted by the telecommunications and computer industry from 19 inch signaling equipment racks standardized originally by the railroad industry in the early 20th century. Equipment racks initially included two posts and were, therefore, commonly known as "two-post racks." To accommodate larger electronic components, two sets of racks were implemented to support the front and back of larger electronic equipment and were known as "four-post racks." Ultimately, four-post equipment racks were integrated into steel cabinets that have a standardized 24" (610 mm) wide footprint, and are typically 800 mm or 1000 mm in depth. The industry standard four-post racks commonly found in datacenters today are enclosed in a steel cabinet, and positioned in rows on 24-inch centers. A difficulty of such a cabinet system is that the cabinet is typically shipped in assembled form with a significant cost of shipping at a fixed standard height to fit through the average door. This legacy equipment rack design effectively limits horizontal and vertical space utilization in the datacenter. It requires each 17.75 inch wide stack of equipment appliance chassis to occupy 24 inches of horizontal floor space, and limits vertical space utilization to the height of the equipment rack installed, not the ceiling height, or cooling capabilities of the datacenter.

Many other difficulties also exist between the independent design requirements of equipment chassis and rack cabinet architectures. Although the typical steel box construction of each rack mountable equipment chassis is very rigid and crush resistant, once mounted into the equipment rack, the mass of the chassis becomes surplus weight that must be supported by the equipment rack. The steel electronic component chassis is not intended to add any additional structural integrity to the equipment rack. Inversely, due to the unknown variable mass of rack-mountable electronic equipment that may be installed into an equipment rack, equipment rack cabinets are engineered to be structurally independent monolithic structures capable of withstanding a maximum potential payload at a fixed height. These independent design approaches further cause excessive material use and unnecessarily add to overall structural mass further impacting datacenter efficiency and utilization.

Though much has changed in computing and telecommunications equipment over the past decades, there has been relatively little change in equipment rack design to better address the densities and efficiencies of modern electronic components and how they are utilized. This not only affects the size, but also the total mass of existing rack cabinet systems, significantly impacting material usage and floor space utilization. As datacenters adopt virtualization and cloud computing to achieve higher levels of efficiencies utilizing large arrays of homogeneous power-efficient equipment, the current art of rack and chassis-based electronic equipment significantly limits more efficient datacenter designs as well as the utilization of existing facilities.

SUMMARY

According to a first aspect, a modular storage system, comprising a plurality of modules coupled together, is provided. Each module includes a top panel and a bottom panel, each of the top panel and bottom panel comprising first and second opposed edges. Each of first and second side members includes: a top edge and a bottom edge, the top edges of the first and second side members being attached to the opposed edges of the top panel, and the bottom edges of the first and second side members being attached to the opposed edges of the bottom panel; and a longitudinal attachment feature running along a length of the side member along a longitudinal axis of the side member, longitudinal attachment features of first and second modules enabling the coupling together of the first and second modules.

In some embodiments, the longitudinal attachment feature comprises a channel formed in at least one of the first and second side members. In some embodiments, the channel has a trapezoidal shape in cross-section. In some embodiments, each side member is an extrusion. In some embodiments, for each of the first and second side members, cross-sections taken in parallel planes orthogonal to the longitudinal axis are the same along the entire length of the longitudinal attachment feature.

In some embodiments, for each of the first and second side members, cross-sections taken in parallel planes orthogonal to the longitudinal axis are the same along the entire length of the longitudinal attachment feature.

In some embodiments, each module stores electronic equipment. In some embodiments, the electronic equipment comprises one or more of computer equipment, power supply equipment and cooling equipment.

In some embodiments, the system further comprises at least one submodule for installation in at least one of the modules, the submodule comprising electronic equipment mounted in the submodule, the submodule enhancing mechanical characteristics of the modular storage system when installed in the one of the modules.

In some embodiments, the system further comprises at least one submodule for installation in at least one of the modules, the submodule comprising: a mounting surface; a mounting bracket mounted on the mounting surface; at least one device mounted to the mounting bracket; and at least one anti-vibration bobbin between the mounting bracket and the mounting surface. In some embodiments, the mounting surface defines at least one aperture through the mounting surface; and the at least one device is mounted to the mounting bracket such that at least a portion of the device penetrates the at least one aperture. In some embodiments, the at least one device is a fan.

In some embodiments, the system further comprises at least one submodule for installation in at least one of the modules, the submodule comprising: a mounting surface, the mounting surface defining at least one aperture through the mounting surface; a mounting bracket mounted on the mounting surface; and at least one device mounted to the mounting bracket such that at least a portion of the device penetrates the at least one aperture. In some embodiments, the at least one device is a fan.

In some embodiments, the system further comprises at least one electronic bus rail for installation in at least one of the modules, the electronic bus rail comprising at least one electrical connection element for connecting to electronic equipment, the electronic bus rail enhancing mechanical characteristics of the modular storage system when installed in the one of the modules. In some embodiments, the at least one electrical connection element comprises an electrical connector, the electrical connector being connectable to a submodule installed in at least one of the modules, the submodule comprising electronic equipment mounted in the submodule.

In some embodiments, the system further comprises an anchor bracket secured to at least one of the first and second side members for securing the module to a supporting surface. In some embodiments, the supporting surface is below the module.

In some embodiments, the system further comprises a side bracket comprising a mating element which mates with the longitudinal attachment feature of at least one of the side members to attach the side bracket to the at least one side member, the side bracket being adapted to permit mounting of the module at the at least one side member.

According to another aspect, a module for a modular storage system is provided. The module includes: a top panel and a bottom panel, each of the top panel and bottom panel comprising first and second opposed edges; and first and second side members. Each of the first and second side members includes: a top edge and a bottom edge, the top edges of the first and second side members being attached to the opposed edges of the top panel, and the bottom edges of the first and second side members being attached to the opposed edges of the bottom panel; and a longitudinal attachment feature running along a length of the side member along a longitudinal axis of the side member, longitudinal attachment features of first and second modules enabling coupling together of the first and second modules.

In some embodiments, the longitudinal attachment feature comprises a channel formed in at least one of the first and second side members. In some embodiments, the channel has a trapezoidal shape in cross-section. In some embodiments, each side member is an extrusion. In some embodiments, for each of the first and second side members, cross-sections taken in parallel planes orthogonal to the longitudinal axis are the same along the entire length of the longitudinal attachment feature.

In some embodiments, each module stores electronic equipment. In some embodiments, the electronic equipment comprises one or more of computer equipment, power supply equipment and cooling equipment.

In some embodiments, the module further comprises at least one submodule for installation in at least one of the modules, the submodule comprising electronic equipment mounted in the submodule, the submodule enhancing mechanical characteristics of the modular storage system when installed in the one of the modules.

In some embodiments, the module further comprises at least one submodule comprising: a mounting surface; a mounting bracket mounted on the mounting surface; at least one device mounted to the mounting bracket; and at least one anti-vibration bobbin between the mounting bracket and the mounting surface. In some embodiments, the mounting surface defines at least one aperture through the mounting surface, and the at least one device is mounted to the mounting bracket such that at least a portion of the device penetrates the at least one aperture. In some embodiments, the at least one device is a fan.

In some embodiments, the module further comprises at least one submodule comprising: a mounting surface, the mounting surface defining at least one aperture through the mounting surface; a mounting bracket mounted on the mounting surface; and at least one device mounted to the mounting bracket such that at least a portion of the device penetrates the at least one aperture. In some embodiments, the module further comprises at least one submodule the at least one device is a fan.

In some embodiments, the module further comprises at least one electronic bus rail for installation in at least one of the modules, the electronic bus rail comprising at least one electrical connection element for connecting to electronic equipment, the electronic bus rail enhancing mechanical characteristics of the modular storage system when installed in the one of the modules.

In some embodiments, the at least one electrical connection element comprises an electrical connector, the electrical connector being connectable to a submodule installed in at least one of the modules, the submodule comprising electronic equipment mounted in the submodule.

In some embodiments, the module further comprises an anchor bracket secured to at least one of the first and second side members for securing the module to a supporting surface. In some embodiments, the supporting surface is below the module.

In some embodiments, the module further comprises a side bracket comprising a mating element which mates with the longitudinal attachment feature of at least one of the side members to attach the side bracket to the at least one side member, the side bracket being adapted to permit mounting of the module at the at least one side member.

According to another aspect, a modular storage method, comprising coupling a plurality of modules together, is provided. The coupling comprises: providing a top panel and a bottom panel, each of the top panel and bottom panel comprising first and second opposed edges; and providing first and second side members, each of the first and second side members comprising a top edge and a bottom edge; attaching the top edges of the first and second side members to the opposed edges of the top panel, and attaching the bottom edges of the first and second side members to the opposed edges of the bottom panel, and providing a longitudinal attachment feature running along a length of the side member along a longitudinal axis of the side member, longitudinal attachment features of first and second modules of the plurality of modules enabling the coupling together of the first and second modules.

In some embodiments, providing the first and second side members comprises performing an extrusion process.

In some embodiments, the longitudinal attachment feature comprises a channel formed in at least one of the first and second side members. In some embodiments, the channel has a trapezoidal shape in cross-section.

In some embodiments, each module stores electronic equipment. In some embodiments, the electronic equipment comprises one or more of computer equipment, power supply equipment and cooling equipment.

According to another aspect, a method of making a module for a modular storage system is provided. The method comprises: providing a top panel and a bottom panel, each of the top panel and bottom panel comprising first and second opposed edges; providing first and second side members, each of the first and second side members comprising a top edge and a bottom edge; attaching the top edges of the first and second side members to the opposed edges of the top panel, and attaching the bottom edges of the first and second side members to the opposed edges of the bottom panel; and providing a longitudinal attachment feature running along a length of the side member along a longitudinal axis of the side member, longitudinal attachment features of first and second modules enabling the coupling together of the first and second modules.

In some embodiments, providing the first and second side members comprises performing an extrusion process.

In some embodiments, the longitudinal attachment feature comprises a channel formed in at least one of the first and second side members. In some embodiments, the channel has a trapezoidal shape in cross-section.

In some embodiments, each module stores electronic equipment. In some embodiments, the electronic equipment comprises one or more of computer equipment, power supply equipment and cooling equipment.

BRIEF DESCRIPTION OF THE DRAWINGS

The foregoing and other features and advantages will be apparent from the more particular description of preferred aspects, as illustrated in the accompanying drawings in which like reference characters refer to the same parts throughout the different views. The drawings are not necessarily to scale, emphasis instead being placed upon illustrating the principles of the invention.

FIGS. 3A, 3B, and 3C contain perspective views of coupling variations of a plurality of shelf frame modules in accordance with some embodiments.

FIGS. 7A and 7B contain a schematic partially exploded perspective view and an assembled perspective view, respectively, of one shelf frame module, one optional equipment subframe node and optional fitments front loaded in accordance with some embodiments.

FIG. 7C contains a detailed view of the circled region illustrated in FIG. 7B, according to some embodiments.

FIGS. 8A and 8B contain a schematic partially exploded perspective view and an assembled perspective view, respectively, of one shelf frame module, one optional equipment subframe node and optional fitments rear loaded in accordance with some embodiments.

FIG. 8C contains a detailed view of the circled region illustrated in FIG. 8B, according to some embodiments.

FIGS. 9A and 9B contain schematic partially exploded perspective views of a reduced height ruggedized mounting configuration for coupling sub-components, in accordance with some embodiments.

DETAILED DESCRIPTION

Figure 1A:
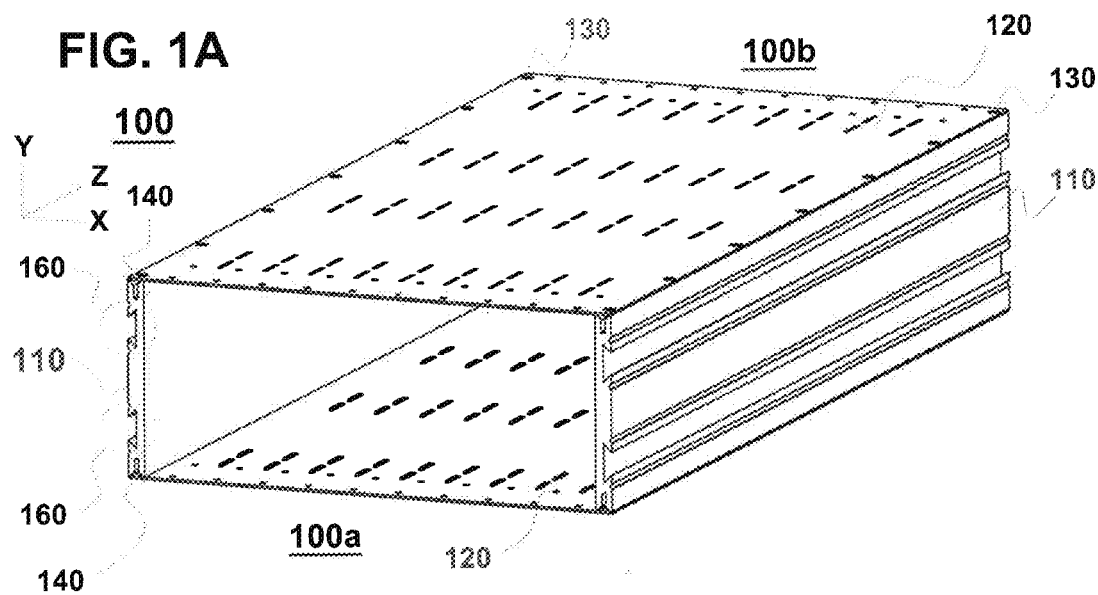
FIGS. 1A and 1B contain a perspective view and an exploded perspective view, respectively, of one shelf frame module enclosure, in accordance with an embodiment.

The present description relates to shelving systems and equipment storage management and more particularly to a structurally integrated building-block shelf frame system for storing electronic and non-electronic equipment subframes that can be mechanically interconnected with minimal labor content to assemble the resultant structure without the requirement of equipment racks or equipment rack cabinets. The present description is given to enable one of ordinary skill in the art to make and use the invention and is provided in the context of a patent application and its requirements. Various modifications to the embodiments described herein and the generic principles and features described herein will be readily apparent to those skilled in the art. For instance, although a finite number of shelf frame structure configurations are illustrated in the embodiments, it is clear that any number or even one shelf frame unit could be utilized.

In accordance with some embodiments, the modular building-block shelf frame system comprises extruded side members designed to withstand and transfer the vertical load of a plurality of stacked shelf frame modules. Extruded side members include a plurality of symmetrical and non-symmetrical geometric mating features to facilitate module assembly and alignment, the incremental stacking of a plurality of shelf frame modules, and the interlocking and self alignment of a plurality of shelf frame modules without the need for additional tooling. A symmetrical top and bottom shelf member includes features to facilitate initial shelf frame module assembly alignment with side members, the alignment of electronic or non-electronic equipment subframes in the shelf frame module, and a system for securing optional equipment subframes to the shelf frame module that efficiently adds additional structural integrity to the overall shelf frame system. An optional electronic equipment subframe system includes features to facilitate securing equipment subframes to the top and bottom members and also provides additional structural integrity to the shelf frame module system. The system also provides ruggedized mounting of standard 1 U electronic components in less then 1.75" (44.5 mm) on an optional electronic equipment subframe. The system also provides electrical connectivity to a plurality of optional equipment subframes in an efficient manner that also provides additional structural integrity to the shelf frame module system.

The resultant structurally integrated building-block shelf frame module can be optionally populated with electronic or non-electronic equipment subframe modules, then individually shipped to a location and stacked to an optimal height and density for a given facility without the use of equipment racks, or can be optionally configured for mounting into legacy equipment racks.

An equipment storage system can be constructed incrementally using structurally integrated shelf frame modules. Each module is adapted to couple to another module side-to-side on plane, or side-to-side on a staggered plane to form a plurality of mated module columns, or to additional side members to form an individual column, or to mounting brackets to enable mounting into standard equipment racks.

Figure 1B:
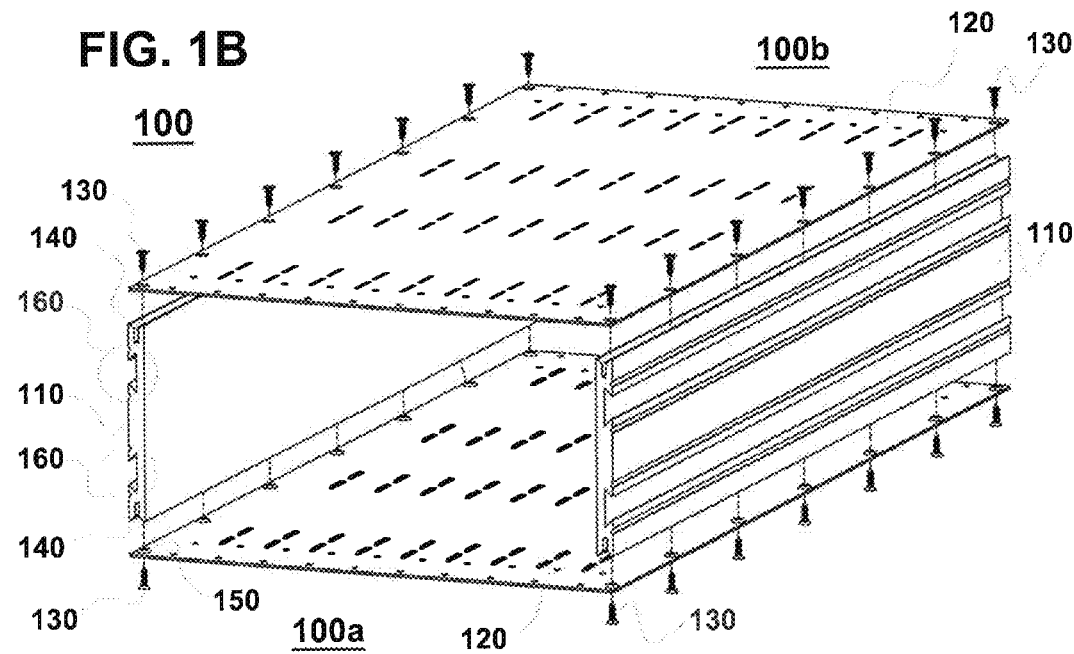

FIGS. 1A and 1B illustrate a perspective view and an exploded perspective view, respectively, of one shelf frame module 100, in accordance with an embodiment. As shown, two extruded side members 110 are coupled perpendicularly to a top and bottom member 120 with a plurality of self tapping screws 130 to form shelf frame module 100. Due to the symmetrical design of the side members 110, both side members utilize one common part in the present embodiment. Similarly, due to the symmetrical design of the top and bottom members 120, both top and bottom members utilize one common part in the present embodiment. Therefore, side members 110 and top and bottom members 120 are economical to manufacture since they represent singular elements needed to implement both side members, and both top and bottom members, respectively. For purposes of illustration, the shelf frame module 100 has a front 100a and back 100b. Due to the symmetrical design of the side members 110 and the top and bottom members 120, the front 100a and back 100b are identical in the resultant assembly 100.

While the height, width and depth of shelf frame module 100 is largely a design choice, in some particular embodiments, the height Y of each shelf frame module 100 is 4 Us high (7 inches or approximately 178 mm), the width X is 17.75 inches wide (approximately 450 mm, leaving an internal usable shelf width of approximately 420 mm), and a depth Z of 900 mm as illustrated in the present embodiment to facilitate optional mounting in 19" standard equipment racks. One skilled in the art could readily deduce that proportionate symmetrical adjustments could be made in the design of the extrusion profile of side member 110 to accommodate other heights. One skilled in the art could also readily deduce that adjustments could be made in the design width X and depth Z of top and bottom member 120 to facilitate mounting into 23" equipment racks, or to attain any other desired equipment shelf width or depth if mounting into legacy equipment racks is not a requirement.

Figure 2A:
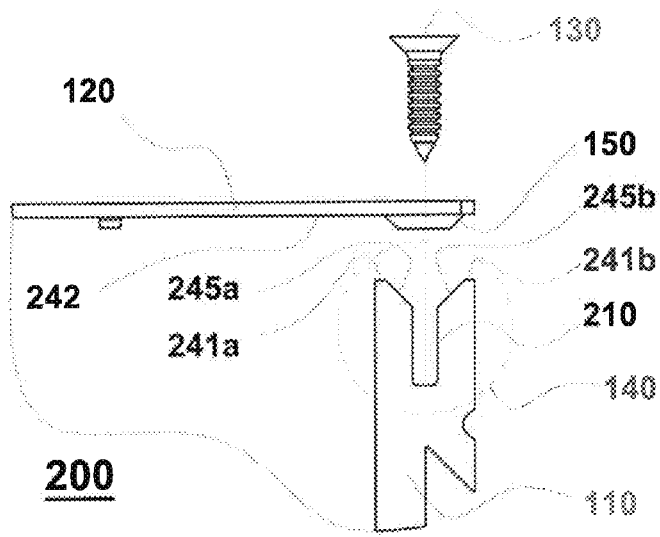
FIGS. 2A, 2B, and 2C contain an exploded cross-sectional view, a partially exploded cross-sectional view and a cross-sectional view, respectively, of a coupling and alignment system of side members and top and bottom members, in accordance with an embodiment.
Figure 2B:
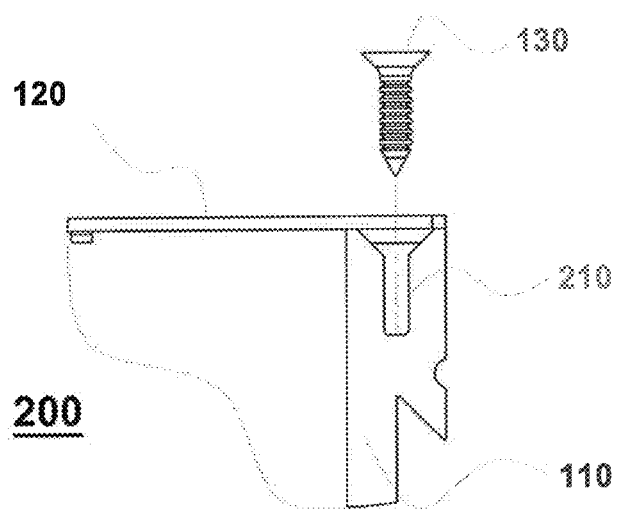
Figure 2C:
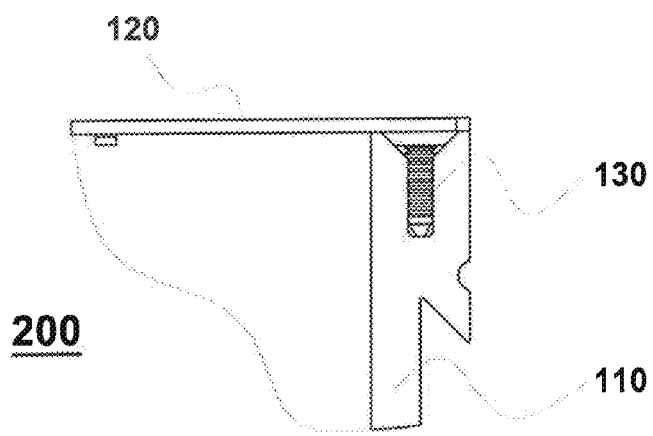

To facilitate shelf frame module assembly, alignment and coupling of side members 110 with the top and bottom members 120, each side members 110 has an alignment feature 140 integrated into the top and bottom edge of each extruded side member 110 to mate with a plurality of embossed countersink features 150 on top and bottom members 120 that are then secured with self tapping screws 130, as shown in FIGS. 1A and 1B. FIGS. 2A, 2B, and 2C contain an exploded cross-sectional view, a partially exploded cross-sectional view and a cross-sectional view, respectively, of a coupling and alignment system of side members and top and bottom members, in accordance with an embodiment. FIGS. 2A, 2B and 2C illustrate the system of alignment and assembly to facilitate coupling of side members 110 to top and bottom members 120.

As shown in FIG. 2A, feature surface 241a and 241b located at each end of side member 110, establish a parallel set of alignment planes with surface 242 on top and bottom member 120 creating a perpendicular orientation between top and bottom member 120 and side member 110, thereby fixing the X and Y axis for assembly. Symmetrical surface features 245a and 245b on the end of each side member 110 are set at a predetermined distance and angle to one another to create a set of alignment planes that receive a plurality of conical emboss countersink alignment features 150, located on top and bottom member 120, thereby fixing the Z axis for final assembly as shown in FIG. 2B. Insertion of a plurality of self tapping screws 130 through emboss countersink features 150 into the self tapping feature channel 210 secure the bottom and top member 120 to side members 110 into a fully aligned assembly as seen in FIGS. 2C and 1B.

FIGS. 3A, 3B, and 3C contain perspective views of coupling variations of a plurality of shelf frame modules in accordance with some embodiments. To facilitate shelf frame module 100 coupling and alignment with other shelf frame modules into single columns, as shown in FIG. 3A, or a plurality of coupled columns, as shown in FIGS. 3B and 3C, each side member 110 has a pair of shelf frame alignment and coupling feature systems 160 integrated into the profile of each extruded side member 110 at a predetermined position, as shown in FIGS. 1A and 1B.

Figures 4A, 4B:
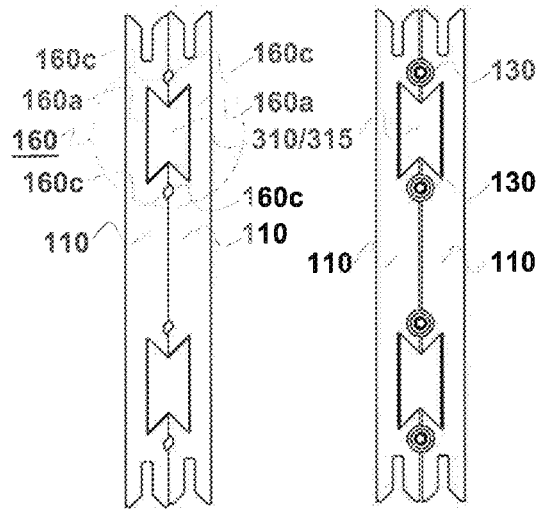
FIGS. 4A, 4B, 5A, 5B, 6A and 6B contain schematic cross-sectional views illustrating variations of side member coupling configurations in accordance with some embodiments.

FIGS. 4A, 4B, 5A, 5B, 6A and 6B contain schematic cross-sectional views illustrating variations of side member coupling configurations in accordance with some embodiments. FIGS. 4A and 4B provide a detail front perspective view of side members 110 in a mated view, and an aligned and fully assembled view, respectively, to illustrate the shelf frame alignment and coupling feature systems 160 developed to facilitate the coupling of a plurality of shelf frame modules 100. Shelf frame module coupling and alignment feature system 160 comprises a longitudinal attachment feature 160a, which in some embodiments is a female trapezoid feature or channel 160a, and a set of self tapping coupling and alignment channels 160c as shown in FIG. 4A. Two shelf frame alignment and coupling feature systems 160 can be mated with joint member 310 or 315 as shown in FIGS. 4A and 3A. The mating illustrated in FIG. 4A results in a partially coupled and aligned set of female trapezoid features 160a and partially aligned pair of self tapping coupling and alignment channels 160c. The insertion of self tapping screws 130 into each pair of self tapping coupling and alignment channels 160c secures the joint member 310 or 315 with the set of female trapezoid features 160a in a fully aligned assembly as illustrated in FIG. 4B. The predetermined positioning of self tapping screws into self tapping and alignment channels 160c is designed to accommodate accessory attachment such as wire management brackets and security doors (not shown), in addition to providing coupling and alignment for a plurality of shelf frame modules 100.

Figures 5A, 5B:
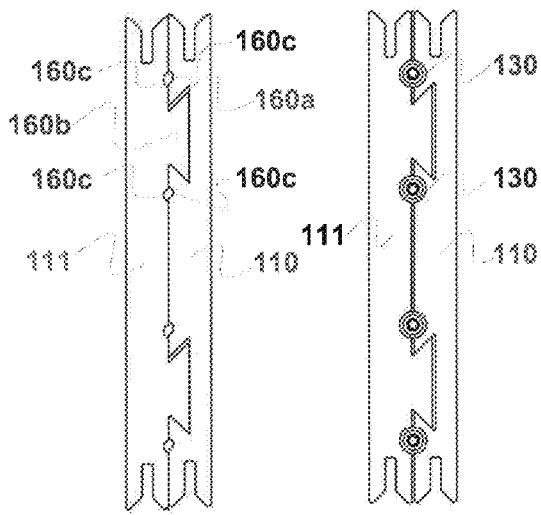

In another embodiment, a female trapezoid feature 160a in side member 110 can be mated directly to a male gendered side member 111 containing a male gendered trapezoid feature 160b as shown in FIG. 5A and FIG. 5B. FIG. 5A illustrates a female trapezoid feature 160a on side member 110 mated with partially coupled with a male trapezoid feature 160b on side member 111. Referring to FIG. 5B, the insertion of self tapping screws 130 into each pair of self tapping coupling and alignment channels 160c secures the side member 110 with male gendered side member 111 into a fully aligned assembly without the use of joint member 310 or 315.

Figures 6A, 6B:
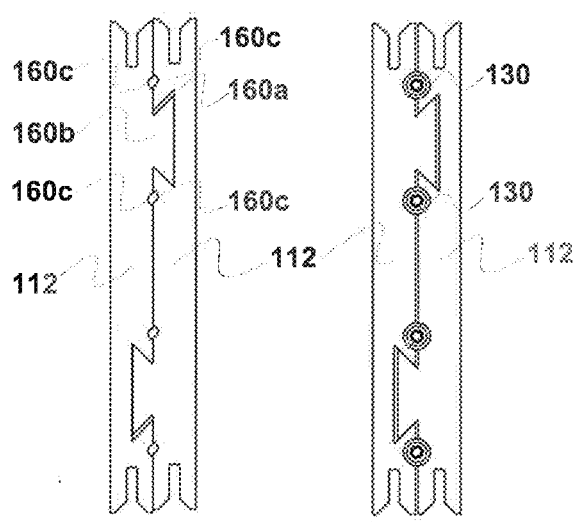

In another embodiment that further reduces part count, an asymmetrically gendered side member 112 is utilized as shown in FIG. 6A and FIG. 6B. As illustrated in FIG. 6A, a female trapezoid feature 160a of one dual-gender side member 112 is mated and partially coupled with a male trapezoid feature 160b of another dual-gender side member 112. Referring to FIG. 6B, the insertion of self tapping screws 130 into each pair of self tapping coupling and alignment features 160c secures side both side members 112 into the a fully aligned assembly with only the use of a singular side member part.

It should be noted that a trapezoidal shape is described above in connection with the coupling of the side members. The feature shape can be other than trapezoidal. That is, the mating shape between side members need not be trapezoidal. For example, in some embodiments, the cross-sectional shape of the mating features may be L-shaped, T-shape or any shape which allows for the interlocking mating described herein.

FIG. 3A illustrates a partially exploded view of three shelf frame modules 100 comprised of side members 110 coupled with additional side members 115, joint members 310 and 315, and anchor brackets 320 secured with self tapping screws 130 to form a single column 300a. FIG. 3B illustrates a side-by-side two-column assembly 300b of six shelf frame modules 100 comprised of side member 110 coupled on a common plane to additional side members 110, joint members 310 and anchor brackets 320 secured with self tapping screws 130. FIG. 3C illustrates a side-by-side three column assembly 300c of nine shelf frame modules 100 comprised of side members 110 coupled on a staggered plane with additional side members 110, joint members 310 and anchor brackets 320 secured with self tapping screws 130.

Anchor bracket 320 can be attached to side members 110 at the bottom of any column for horizontal stability and floor anchoring, as shown in FIGS. 3A, 3B and 3C, or at the top of any column for overhead structural support anchoring attachment (not shown). A plurality of anchor holes 321 in anchor bracket 320 can be used for anchor bolts to secure a shelf module column to a floor, or for optional rolling casters (not shown) to provide mobility to shelf module column 300a.

FIGS. 7A, 7B and 7C illustrate one shelf frame module 100 with optional fitments in an isometric exploded view, isometric assembled view, and an enlarged detailed view, respectively. The optional fitment embodiments include four rack adapter brackets 170, an equipment subframe example node 180, and a structurally integrated electronic bus rail 190. For purposes of illustration, the shelf frame module 100 has a front 100a and back 100b. FIGS. 8A, 8B and 8C include the same illustrations of the shelf frame module 100 and fitments of FIGS. 7A, 7B and 7C, respectively, with the fitments being installed from the rear 100b of the shelf frame module 100.

If a particular implementation requires installation of shelf frame module 100 into equipment racks, each shelf frame module 100 can be installed into standard equipment racks with optional rack adapter brackets 170 as illustrated in FIGS. 7A, 7B and 7C. Rack adapter bracket 170 is designed to slide into longitudinal attachment feature 160a, such as female trapezoid features or channels 160a in side member 110 to the depth required for any given equipment rack implementation as illustrated in FIGS. 7A and 7B. To that end, the rack adapter bracket 170 may include a feature, such as a male trapezoidal feature 160b described above in connection with FIGS. 5A and 6A, which mates with the features, such as the female trapezoidal features 160a described above in connection with FIGS. 5A and 6A, in the side members 110. The front rack adapter brackets 170 can then be secured to side member 110 with set screws 171 as show in FIG. 8C, then mounted to an equipment rack through mount holes 172. The rear rack adapter brackets 170 can then be installed from the rear and secured (as described above) and then mounted to the rear rails of an equipment rack for additional support. Optionally, the set of four rack adapter brackets 170 can be installed on the four rails of an equipment rack at a predetermined height, and then a shelf frame module 100 can be slid to the desired depth and secured with set screws 171.

To facilitate optional equipment subframe node 180 insertion alignment in a shelf frame module 100, as shown in FIGS. 7A and 7B, each top and bottom member 120 has a plurality of rows of alignment features 710 located at predetermined positions, as shown in FIG. 7C. These rows of alignment feature 710 are placed by design symmetrically and equidistantly from one another to maintain the symmetry of top and bottom member 120. To facilitate optional equipment coupling to shelf frame module 100, each top and bottom member 120 also has a plurality of rows of embedded threaded fasteners 720 located at predetermined positions, as shown in FIG. 7C. The rows of embedded threaded fasteners 720 are also placed by design symmetrically and equidistantly from one another to maintain the symmetry of top and bottom member 120. The combined symmetry of alignment feature 710 and embedded threaded fasteners 720 enable a singular part to be utilized in production of top and bottom member 120.

Each optional equipment subframe node 180 is designed to be structurally complementary to the shelf frame module 100. As can be seen in FIG. 8A, each equipment subframe node 180 can be formed in a C-shape from one contiguous piece of material with a vertical equipment mount surface 830 and a symmetrical top and bottom plate support surface 835 creating an open frame. By creating an open frame and eliminating one side surface, material usage is minimized, and the total width of the optional equipment subframe node 180 is reduced. Each end of the optional equipment subframe node 180 may include a symmetrical box rib feature 840 to add additional rigidity at each end of the subframe. The tab ends 850 of each end of the top and bottom have captive screws 855 installed for threaded structural fastening of the equipment subframe node 180 to embedded threaded fasteners 720 in the top and bottom plate 120, as shown in FIGS. 7A and 7C. The structurally integrated symmetrical design of the equipment subframe node 180 with the shelf frame module 100 enables the equipment subframe node 180 to be installed in any orientation at a variety of depths while adding structural integrity to the overall shelf frame system. As an example, the complementary symmetrical design of frame module 100 and the equipment subframe node 180 enables the equipment subframe node 180 to be installed and structurally coupled in a shelf frame module 100 from front 100a, or back 100b regardless of shelf frame module 100 orientation, as illustrated in FIGS. 7A and 8A. Vertical equipment mount surface 830 can be utilized to mount a wide array of equipment types, as an example, printed circuit boards for compute intensive applications, or storage drives and controllers for storage intensive applications along with device sub components such as power supplies and cooling fans to meet the requirements of a given node.

The overall size and depth of the of each optional equipment subframe nodes 180 can be selected based on parameters of the shelf frame module 100 to accommodate any desired size. In the present particular exemplary embodiment, a width in the present preferred embodiment of 42 mm enables up to ten optional equipment frames to be installed.

A system for device mounting according to some embodiments accommodates the ruggedized mounting and coupling of existing 1 U (1.75 inches/44.5 mm) electronic device sub-components such as 1 U power supply units (not shown) and cooling fans 875, in an optional equipment subframe node 180 designed with a equipment mounting clearance of less than 1.75 inch (44.5 mm), as shown in FIGS. 7A, 8A and 9A-9C. 1 U device sub-components are typically designed to fit just within a 1 U equipment chassis and lack the additional oscillation clearances required for anti-vibration bobbins used to isolate a vibrating component in a ruggedized environment, or to protect a component mounted in a harsh environment prone to vibration and shock.

Figure 9C:
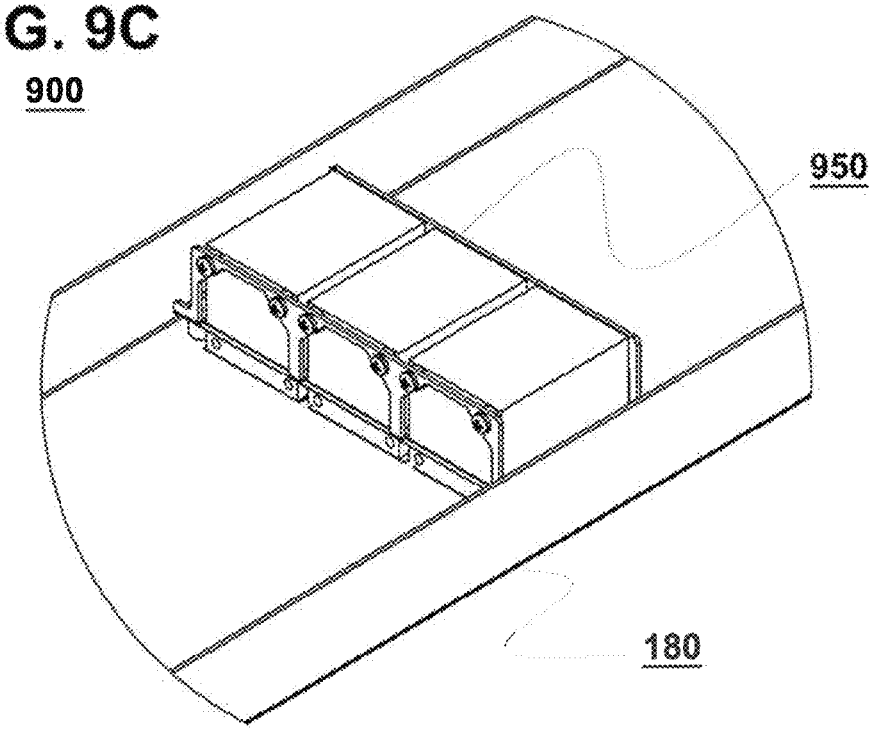
FIG. 9C contains a schematic perspective assembled view of the reduced height ruggedized mounting configuration for coupling sub-components illustrated in FIGS. 9A and 9B, in accordance with some embodiments.
Figure 9D:
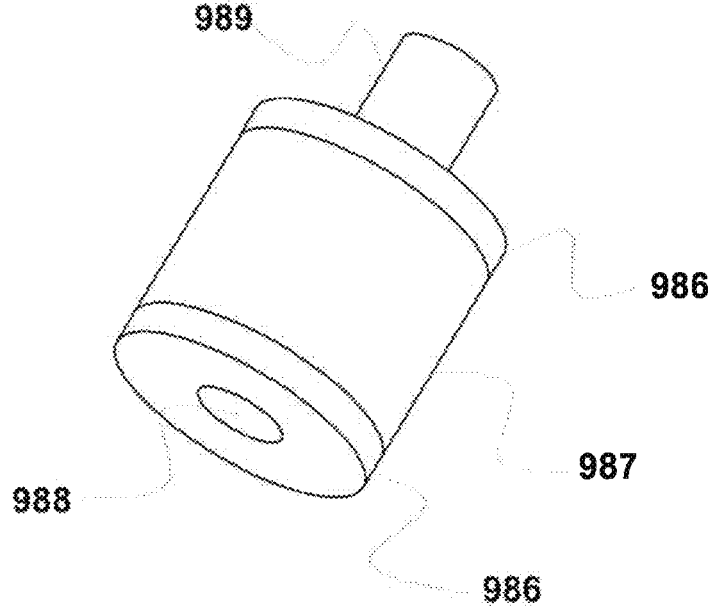
FIG. 9D is a schematic perspective view of an anti-vibration bobbin used in the reduced height ruggedized mounting configuration for coupling sub-components illustrated in FIGS. 9A-9C, in accordance with some embodiments.

FIGS. 9A, 9B and 9C include a fully exploded, partially exploded and assembled isometric view, respectively, of equipment subframe node 180 lying flat, with cooling fans 875a-875c, as an example, to illustrate the system of ruggedized mounting and coupling 900 devised to solve this problem. FIG. 9D illustrates an anti-vibration bobbin 985 that includes two metal anti-vibration mount plates 986 separated by an elastic rubber or polymer 987 used to prevent shock and vibration from transferring between two isolated planes, each of which is mechanically coupled to one of the anti-vibration mount plates 986. Anti-vibration mount plates 986 may contain a threaded hole 988 or a threaded shaft 989 to facilitate coupling. As illustrated in FIG. 9A, individual cooling fans 875a-875c are mounted into an anti-vibration adapter bracket 980, secured with a plurality of fan screws 981. Anti-vibration bobbins 985 are coupled to anti-vibration adapter bracket 980 through threaded mount holes 986 located in the anti-vibration adapter bracket 980 to form an anti-vibration fan sub-assembly 950 and complete the first part of the system, as shown in FIG. 9B. The exemplary anti-vibration adapter bracket 980 is designed to mount the standard 1 U fans at a height that is lower than vertical equipment surface 830 to provide the additional clearances required for anti-vibration oscillation and low clearance mounting. To accommodate a negative depth mount design, the vertical equipment surface 830 has a plurality of relief cutouts or apertures 990 and mounting holes 995 located in predetermined positions, as shown in FIG. 9B. The anti-vibration fan sub-assembly 950 is coupled to the equipment subframe node 180 with mounting screws 996 through mounting holes 995 to couple the assembly and complete the system of device mounting, as shown in FIGS. 8A, 9B and 9C.

The mounting system of FIGS. 9A through 9D allows for the additional clearances required for anti-vibration mounting and the oscillation of components for ruggedized mounting. It also reduces the mounting height required of a standard 1 U electronic device sub-component, thereby allowing 1 U standard electronic sub-components to be mounted in an equipment subframe 180, or other chassis that is less than 1.75" (44.5 mm).

In some exemplary embodiments, the equipment subframe node 180 has an optional male electronic connector 870, as illustrated in FIG. 8A, that can be connected to an external cable or cables (not shown) for power or data termination. The male electronic connector 870 on the equipment subframe node 180 may also be terminated into the electronic bus rail 190. The electronic bus rail 190 is designed to reduce cabling and provide additional structural integrity to the overall shelf frame module 100, as illustrated in FIGS. 8A, 8B and 8C.

As shown in FIG. 8A, electronic bus rail 190 comprises a pair of coupled plates 191 that create a structurally integrated wire enclosure with a plurality of female electronic bus connectors 192 placed at predetermined locations to align and mate with electronic bus connector 870 on the equipment subframes 180 when inserted into the shelf frame module 100. To facilitate coupling to the top and bottom member 120 of the shelf frame module 100, captive screws 871 are located on the electronic bus rail 190 to align with the embedded threaded fasteners 720 on the top and bottom member 120. Once coupled to top and bottom member 120 of a shelf frame 100 module, as illustrated in FIGS. 8A and 8B, equipment subframes 180 may be inserted into the shelf frame module 100 for consolidated power or data termination in as shown in FIGS. 8B and 8C, while adding structural integrity to the overall shelf frame system.

According to some embodiments, a structurally integrated modular shelf frame equipment storage system can be built according to a user's specific needs that best utilize the capability of given facility. The systems, modules and methods described herein provide an efficient approach to storing equipment and reducing infrastructure cost. The flexibility and scalability of the structurally integrated modular shelf frame systems, modules and methods described herein satisfy those needs, as well as others.

For instance, in some embodiments, because the structurally integrated frame system is modular, shelf frame modules can be fully pre-populated with equipment and wire management, and then shipped to a given location. There they can be modularly stacked and coupled without the need for existing equipment rack infrastructure, or optionally mounted into existing equipment racks. Additionally, this modularity aids in the task of physically relocating equipment by eliminating the need to remove individual components.

Although the present invention has been described in accordance with the embodiments shown, one of ordinary skill in the art will readily recognize that there could be variations to the embodiments and those variations would be within the spirit and scope of the present invention. For instance, the shelf frame modules described in detail above could be coupled using another method or using alternative geometric shapes to those described above, or the height and width of the members can vary depending on the user's needs. Accordingly, many modifications may be made by one of ordinary skill in the art without departing from the spirit and scope of the appended claims.

The invention claimed is:

1. A modular storage system comprising
a first module;
a second module being coupled to the first module;
a plurality of mating fasteners; and
a plurality of joint members;
wherein, each of the first and second modules comprising:
a top panel and a bottom panel, each of the top panel and bottom panel comprising first and second opposed edges; and
first and second extruded identical side members, each of the first and second extruded identical side members comprising:
a top edge and a bottom edge, each edge defining a self-tapping channel for receiving ones of the plurality of mating fasteners, wherein top edges of the first and second extruded identical side members being attached to opposed edges of the top panel, and the bottom edges of the first and second extruded identical side members being attached to opposed edges of the bottom panel using ones of the plurality of mating fasteners, and
a longitudinal attachment feature running along a length of a side member along a longitudinal axis of the side member, wherein the longitudinal attachment features of respective side members of the first and the second modules enabling the coupling together of the first and second modules, wherein when the first and second modules are positioned side by side, longitudinal attachment features of respective first and second modules are aligned and wherein the joint members are sized and shaped to engage with the longitudinal attachment features so as to enable the first and second modules to be coupled.

2. The modular storage system of claim 1, wherein the longitudinal attachment feature comprises a channel.

3. The modular storage system of claim 2, wherein the channel has a trapezoidal shape in cross-section.

4. The modular storage system of claim 2, wherein, for each of the extruded identical first and second side members, cross-sections taken in parallel planes orthogonal to the longitudinal axis are a same along an entire length of the longitudinal attachment feature.

5. The modular storage system of claim 1, wherein each module is configured to store electronic equipment.

6. The modular storage system of claim 5, wherein the electronic equipment comprises one or more of computer equipment, power supply equipment or cooling equipment.

7. The modular storage system of claim 1, further comprising at least one submodule for installation in at least one of the modules, the submodule comprising mounted electronic equipment.

8. The modular storage system of claim 7, the submodule comprising:
a mounting surface;
a mounting bracket mounted on the mounting surface;
at least one device mounted to the mounting bracket; and
at least one anti-vibration bobbin between the mounting bracket and the mounting surface.

9. The modular storage system of claim 8, wherein:
the mounting surface defines at least one aperture through the mounting surface; and
the at least one device is mounted to the mounting bracket such that at least a portion of the device penetrates the at least one aperture.

10. The modular storage system of claim 9, wherein the at least one device is a fan.

11. The modular storage system of claim 7, the submodule comprising:
a mounting surface, the mounting surface defining at least one aperture through the mounting surface;
a mounting bracket mounted on the mounting surface; and
at least one device mounted to the mounting bracket such that at least a portion of the device penetrates the at least one aperture.

12. The modular storage system of claim 11, wherein the at least one device is a fan.

13. The modular storage system of claim 1, further comprising at least one electronic bus rail for installation in at least one of the first or second modules, the electronic bus rail comprising at least one electrical connection element for connecting to electronic equipment, the electronic bus rail enhancing mechanical characteristics of the modular storage system when installed in the one of the first or second modules.

14. The modular storage system of claim 13, wherein the at least one electrical connection element comprises an electrical connector, the electrical connector being connectable to the submodule installed in at least one of the first or second modules.

15. The modular storage system of claim 1, further comprising an anchor bracket secured to at least one of the first and second side members for securing the first or second module to a supporting surface.

16. The modular storage system of claim 15, wherein the supporting surface is located below a bottom surface of a corresponding module.

17. The modular storage system of claim 1, further comprising a side bracket comprising a mating element which mates with the longitudinal attachment feature of at least one of the side members to attach the side bracket to the at least one side member, the side bracket being adapted to permit mounting in a stack one of the first or second module at the at least one side member to another module.

18. A module for a modular storage system, comprising:
a top panel and a bottom panel, each of the top panel and bottom panel comprising first and second opposed edges; and
extruded identical first and second side members, each of the first and second side members comprising:
a top edge and a bottom edge, each edge defining a self-tapping channel for receiving mating fasteners, wherein the top edges of the first and second side members being attached to the opposed edges of the top panel, and the bottom edges of the first and second side members being attached to the opposed edges of the bottom panel using the mating fasteners that are tapped into respective locations in the respective self-tapping channel,
plural alignment channels; and
a longitudinal attachment feature running along a length of the side member along a longitudinal axis of the side member wherein the longitudinal attachment feature being shaped to receive a joint member so as to enable joining or stacking additional modules to the module, wherein an alignment channel is disposed above and below the longitudinal attachment feature, the alignment channel configured to receive a mating fastener to secure the joint member with the longitudinal attachment in a fully aligned assembly and facilitate coupling the modules when stacked or joined.

19. The module of claim 18, wherein the longitudinal attachment feature comprises a channel.

20. The module of claim 19, wherein the channel has a trapezoidal shape in cross-section.

21. The module of claim 19, wherein, for each of the first and second side members, cross-sections taken in parallel planes orthogonal to the longitudinal axis are a same along an entire length of the longitudinal attachment feature.

22. The module of claim 18, wherein each module is configured to store electronic equipment.

23. The module of claim 22, wherein the electronic equipment comprises one or more of computer equipment, power supply equipment or cooling equipment.

24. The module of claim 18, further comprising at least one submodule configured for installation in at least one of the first or second modules, the submodule comprising mounted electronic equipment.

25. The module of claim 24, wherein the submodule comprising: a mounting surface;
a mounting bracket mounted on the mounting surface;
at least one device mounted to the mounting bracket; and
at least one anti-vibration bobbin between the mounting bracket and the mounting surface.

26. The module of claim 25, wherein:
the mounting surface defines at least one aperture through the mounting surface; and the at least one device is mounted to the mounting bracket such that at least a portion of the device penetrates the at least one aperture.

27. The module of claim 26, wherein the at least one device is a fan.

28. The module of claim 18, wherein the submodule comprising: a mounting surface, the mounting surface defining at least one aperture through the mounting surface;
a mounting bracket mounted on the mounting surface; and
at least one device mounted to the mounting bracket such that at least a portion of the device penetrates the at least one aperture.

29. The module of claim 28, wherein the at least one device is a fan.

30. The module of claim 18, further comprising at least one electronic bus rail for installation in at least one of the first or second modules, the electronic bus rail comprising at least one electrical connection element for connecting to electronic equipment, the electronic bus rail enhancing mechanical characteristics of the modular storage system when installed in the one of the first or second modules.

31. The module of claim 30, wherein the at least one electrical connection element comprises an electrical connector, the electrical connector being connectable to the submodule installed in at least one of the first or second modules.

32. The module of claim 18, further comprising an anchor bracket secured to at least one of the first or second side members for securing the module to a supporting surface.

33. The module of claim 18, wherein the supporting surface is located below a bottom surface of a corresponding module.

34. The module of claim 18, further comprising a side bracket comprising a mating element which mates with the longitudinal attachment feature of at least one of the side members to attach the side bracket to the at least one side member, the side bracket being adapted to permit mounting in a stack one of the first or second module at the at least one side member to another module.

\* \* \* \* \*